(12) United States Patent
Wang et al.

(10) Patent No.: US 8,841,066 B2
(45) Date of Patent: Sep. 23, 2014

(54) PHOTORESIST STRIPPING TECHNIQUE

(71) Applicant: Taiwan Semiconductor Manufacturing Company, Inc., Hsin-Chu (TW)

(72) Inventors: Chien-Wei Wang, Wufong Township, Taichung County (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/942,357

(22) Filed: Jul. 15, 2013

(65) Prior Publication Data

US 2013/0303421 A1 Nov. 14, 2013

Related U.S. Application Data

(62) Division of application No. 12/566,762, filed on Sep. 25, 2009, now Pat. No. 8,512,939.

(51) Int. Cl.
  *G03F 7/26* (2006.01)
  *G03F 7/42* (2006.01)
  *H01L 21/311* (2006.01)

(52) U.S. Cl.
  CPC .......... *G03F 7/425* (2013.01); *H01L 21/31133* (2013.01)
  USPC .......................................... 430/325; 430/331

(58) Field of Classification Search
  USPC ................... 430/325; 510/175, 176
  See application file for complete search history.

(56) References Cited

U.S. PATENT DOCUMENTS

| | | | |
|---|---|---|---|
| 5,627,010 | A | 5/1997 | Pai et al. |
| 5,650,261 | A | 7/1997 | Winkle |
| 6,338,934 | B1 | 1/2002 | Chen et al. |
| 6,395,451 | B1 | 5/2002 | Jung et al. |
| 6,551,973 | B1 | 4/2003 | Moore |

(Continued)

FOREIGN PATENT DOCUMENTS

| | | |
|---|---|---|
| EP | 2093269 | 8/2009 |
| JP | 04134348 | 5/1992 |

(Continued)

OTHER PUBLICATIONS

R.M. Finne et al., Journal of the Electrochemical Society, vol. 114, Issue 9, pp. 965-970, Sep. 1967.

(Continued)

*Primary Examiner* — Chanceity Robinson
(74) *Attorney, Agent, or Firm* — Haynes and Boone, LLP

(57) ABSTRACT

Photoresist stripping solutions are disclosed. An exemplary solution includes an organic solvent and an organic base, wherein the organic base is represented by the formula:

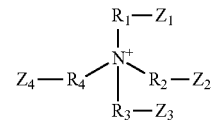

wherein $R_1$—$Z_1$, $R_2$—$Z_2$, $R_3$—$Z_3$, and $R_4$—$Z_4$ are steric hindered functional groups, and further wherein $R_1$, $R_2$, $R_3$, and $R_4$ are each an alkyl group and $Z_1$, $Z_2$, $Z_3$, and $Z_4$ are each a pendant group selected from the group consisting of —Cl, —Br, —I, —NO$_2$, —SO$_3$—, —H—, —CN, —NCO, —OCN, —CO$_2$—, —OC(O)CR*, —SR*, —SO$_2$N(R*)$_2$, —SO$_2$R*, —OC(O)R*, —C(O)R*, —Si(R*)$_3$, and an epoxyl group.

20 Claims, 3 Drawing Sheets

(56) References Cited

U.S. PATENT DOCUMENTS

| | | |
|---|---|---|
| 6,884,561 B2 | 4/2005 | Fromson et al. |
| 6,967,072 B2 | 11/2005 | Latchford et al. |
| 7,005,229 B2 | 2/2006 | Nirmal et al. |
| 7,229,747 B2 | 6/2007 | Park et al. |
| 7,507,520 B2 | 3/2009 | Lee et al. |
| 7,645,812 B2 | 1/2010 | Ahn et al. |
| 8,216,767 B2 | 7/2012 | Wang et al. |
| 2003/0134221 A1 | 7/2003 | Nishiyama et al. |
| 2003/0138737 A1 | 7/2003 | Wakiya et al. |
| 2004/0106532 A1 | 6/2004 | Yokoi et al. |
| 2006/0024616 A1 | 2/2006 | Clark et al. |
| 2010/0151386 A1 | 6/2010 | Shimizu et al. |
| 2010/0297419 A1 | 11/2010 | Courtenay et al. |
| 2011/0070542 A1 | 3/2011 | Wang et al. |
| 2011/0097669 A1 | 4/2011 | Fukui et al. |

FOREIGN PATENT DOCUMENTS

| | | |
|---|---|---|
| JP | 11-251214 | 9/1999 |
| JP | 2009036960 | 2/2009 |
| WO | WO-2009/094023 | 7/2009 |

OTHER PUBLICATIONS

Cyril Nicolas et al., "Catalytic Aerobic Photooxidation of Primary Benzylic Amines Using Hindered Acridinium Salts," www.sciencedirect.com, May 23, 2005, 4 pages.

Wen-Li Wu et al., "Identifying Materials Limits of Chemically Amplified Photoresists," Advances in Resist Materials and Processing Technology XXIV, Proc. of SPIE vol. 6519, 651902 (2007), 0277-0786X/07, 11 pages.

PHOTORESIST STRIPPING TECHNIQUE

CROSS-REFERENCE TO RELATED APPLICATIONS

This application is a divisional of U.S. application Ser. No. 12/566,762, which was filed on Sep. 25, 2009, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

It has been observed that conventional photoresist stripping solutions may exhibit one or more disadvantages. For example, dry etching plasma removal methods and aqueous based stripping solutions may cause damage to the underlying substrate or patterning layer. The damaged layer may then exhibit poor electric performance, poor yield, and high cost of ownership. Traditional organic stripping solutions may leave small portions of photoresist material behind, which can result in deformities in subsequently deposited layers. Accordingly, what is needed is a method and photoresist stripping solution for manufacturing an integrated circuit device that addresses these issues.

SUMMARY

The present disclosure provides for many different embodiments. In an embodiment, a photoresist stripping composition for integrated circuit device patterning processes is provided. The photoresist stripping solution may comprise an organic solvent and a steric hindered organic base. The steric hindered organic base may include at least one of a primary amine, secondary amine, tertiary amine, or quaternary amine hydroxide.

A method for fabricating an integrated circuit device is also disclosed. In an embodiment, the method may include providing a substrate; forming a first material layer over the substrate; forming a patterned second material layer over the substrate; and removing the patterned second material layer with a fluid comprising a steric hindered organic base and organic solvent.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
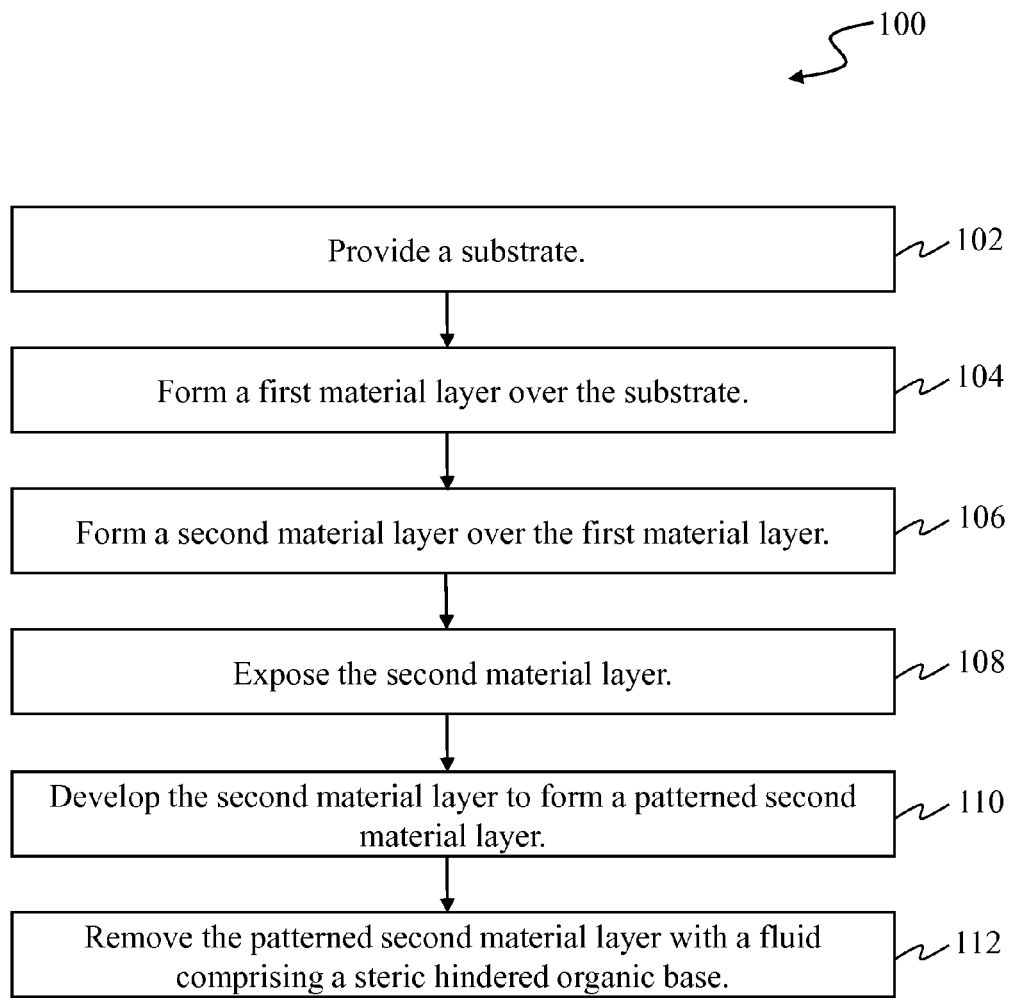
FIG. 1 is a flow chart of a method for fabricating an integrated circuit device according to aspects of the present disclosure.

The present disclosure relates generally to methods for manufacturing semiconductor devices, and more particularly, to a method and photoresist stripping solution for patterning various semiconductor device features.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature (and like descriptions) may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

With reference to FIG. 1 and FIGS. 2A-2D, a method 100 and a semiconductor device 200 are collectively described below. The semiconductor device 200 may be an integrated circuit, or portion thereof, that may comprise memory cells and/or logic circuits. The semiconductor device 200 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. FIG. 1 is a flow chart of one embodiment of the method 100 for making the semiconductor device 200. FIGS. 2A-2D are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated for additional embodiments of the method. It is further understood that additional features can be added in the semiconductor device 200, and some of the features described below can be replaced or eliminated for additional embodiments of the semiconductor device 200. The method 100 and the corresponding semiconductor device 200 is exemplary only and not intended to be limiting. For example, the structure of the IC device depicted in FIGS. 2A-2D is exemplary only and similar methods may be used to form any similar device.

The method 100 is a lithography method for use in manufacturing a semiconductor device. The terms lithography, immersion lithography, photolithography, and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS), a substrate may go through the photolithographic cycle a number of times.

Figure 2A:
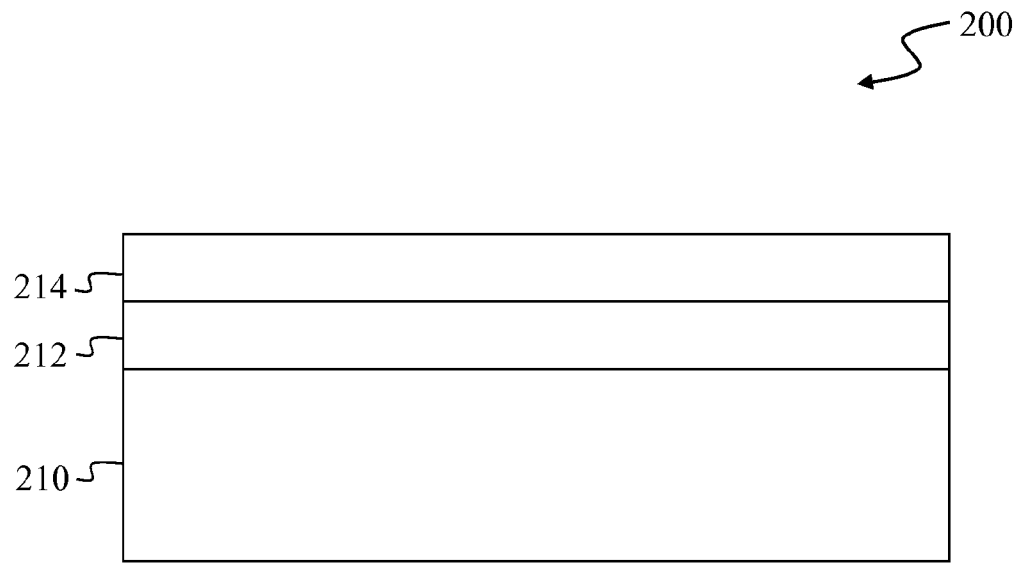
FIGS. 2A-2D are various cross-sectional views of embodiments of an integrated circuit device during various fabrication stages according to the method of FIG. 1.

Referring to FIGS. 1 and 2A, at block 102 of the method 100, a substrate 210 is provided. The substrate 210 may be a semiconductor substrate that includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate may be a semiconductor on insulator (SOI). In some examples, the substrate may include a doped epi layer. In other examples, the silicon substrate may include a multilayer compound semiconductor structure. Alternatively, the substrate 210 may include a non-semiconductor material, such as a glass substrate for thin-film-transistor liquid crystal display (TFT-LCD) devices, or fused quartz or calcium fluoride for a photomask (mask).

The substrate 210 may comprise one or more material layers. The one or more material layers may comprise one or more high-k dielectric layers, gate layers, hard mask layers, interfacial layers, capping layers, diffusion/barrier layers, dielectric layers, conductive layers, other suitable layers, and/or combinations thereof. A high-k dielectric layer may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO2-Al2O3) alloy, other suitable high-k dielectric materials, and/or combinations thereof. A gate layer may comprise silicon-containing materials; germanium-containing materials; metal, such as aluminum, copper, tungsten, titanium, tantulum, titanium nitride, tantalum nitride, nickel silicide, cobalt silicide, TaC, TaSiN, and/or TaCN; other suitable materials; and/or combinations thereof. In one example, the gate layer comprises a layer of silicon dioxide and a layer of high-k dielectric material. The gate layer may be doped polycrystalline silicon with the same or different doping. The gate layer may comprise a work function layer. For example, if a P-type work function metal (P-metal) is desired, TiN, WN, or W may be used. On the other hand, if an N-type work function metal (N-metal) is desired, TiAl, TiAlN, or TaCN, may be used. In some examples, the work function layer may include doped-conducting metal oxide materials.

In one example, the substrate 210 includes a dielectric material. The dielectric material may exhibit a dielectric constant ranging between about 1 and about 40. In another example, the substrate 210 comprises at least one of silicon, a metal oxide, or a metal nitride. The composition of the substrate may be represented by a formula, MXb, where M is a metal or Si, X is N or O, and b ranges between about 0.4 and about 2.5. Examples of substrate compositions including at least one of silicon, metal oxide, or metal nitride include SiO2, silicon nitride, aluminum oxide, hafnium oxide, lanthanum oxide, other suitable compositions, and combinations thereof. In yet another example, the substrate 210 comprises at least one of a metal, a metal alloy, a metal nitride, a metal sulfide, a metal selenide, a metal oxide, or a metal silicide. The composition of the substrate may be represented by a formula, MXa, where M is a metal, X is N, S, Se, O, or Si, and a ranges between about 0.4 and about 2.5. Examples of substrate compositions including at least one of metal, metal alloy, or metal nitride/sulfide/selenide/oxide/silicide include Ti, Al, Co, Ru, TiN, WN2, TaN, other suitable compositions, and/or combinations thereof. Also, the substrate 210 may be substantially conductive or semi-conductive. For example, the electric resistance of the substrate 210 may be less than 103 ohm-meter.

At blocks 104 and 106, a first material layer 212 and a second material layer 214 are formed over the substrate 210. Alternatively, the first material layer 212 may be eliminated and the second material layer 214 may be formed over the substrate 210. The first material layer 212 comprises a different composition than the second material layer 214. The first and second material layers 212, 214 are coated on the substrate 210 to any suitable thickness by any suitable process, such as spin-on coating, chemical vapor deposition (CVD), plasma enhanced CVD (PECVD), atomic layer deposition (ALD), physical vapor deposition (PVD), high density plasma CVD (HDPCVD), other suitable methods, and/or combinations thereof. The first material layer 212 may comprise a different optical property than the second material layer 214. For example, the first material layer 212 may comprise a substantially different refractive index (i.e., n value), extinction coefficient (i.e., k value), or T value than the second material layer 214. The first and second material layers 212, 214 may further comprise different etching resistances. The first and/or second material layers 212, 214 may comprise at least one etching resistant molecule, which may include a low onishi number structure, a double bond, triple bond, silicon, silicon nitride, Ti, TiN, Al, aluminum oxide, and/or SiON.

The first material layer 212 is a patterning layer. The patterning layer may comprise one or more layers similar to those described above, including photoresist layers, antireflective coating layers (e.g., a top antireflective coating layer (TARC) and/or a bottom antireflective coating layer (BARC)), high-k dielectric layers, gate layers, hard mask layers, interfacial layers, capping layers, diffusion/barrier layers, dielectric layers, conductive layers, other suitable layers, and/or combinations thereof. In one example, the first material layer 212 comprises a BARC layer. In another example, the first material layer 212 comprises at least one of an acid labile molecule, a polymer, photoacid generator (PAG), quencher, chromophore, crosslinker, surfactant, and/or solvent.

The second material layer 214 is a photoresist layer comprising any suitable material. The photoresist layer is a positive-type or negative-type resist material. The second material layer 214 may have a multi-layer structure. One exemplary resist material is a chemical amplifying (CA) resist. The second material layer 214 comprises at least one of a polymer, a photoacid generator (PAG), a quencher (base), a chromophore, and/or a solvent. The polymer may comprise an organic or inorganic polymer with a molecular weight between approximately 1000 and 20,000. The polymer may include an acid cleavable polymer, an acid catalyzed crosslinkable polymer, a polymeric pinacol, and/or other suitable polymer. The second material layer 214 may further comprise a surfactant, a photodegradable base, a photobase generator (PBG), an electron acceptor, and/or crosslinker.

Figure 2B:
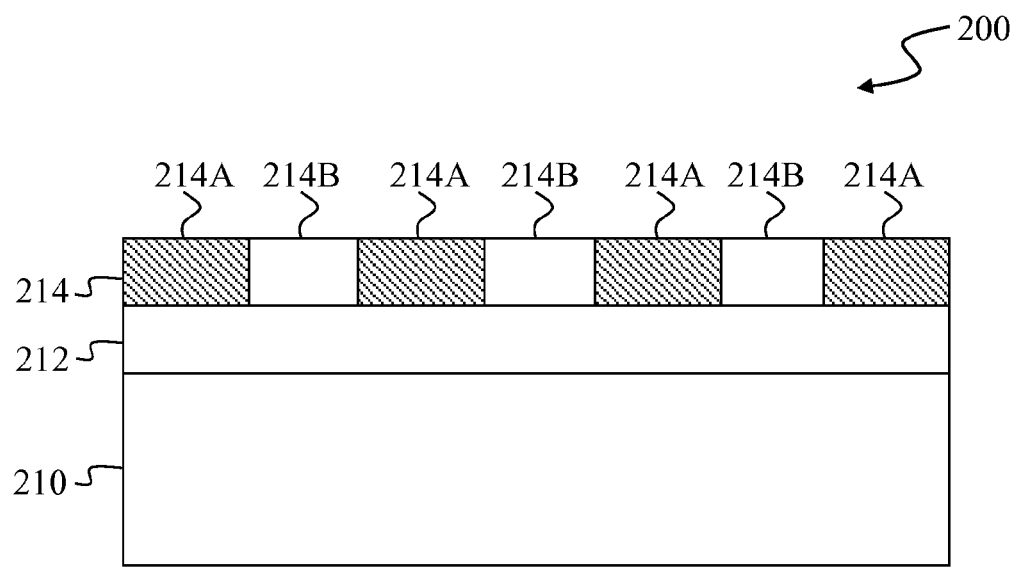

At block 108, at least one exposure process is performed on the second material layer 214. The exposure process selectively illuminates the second material layer 214 by a radiation beam to form one or more exposed portions 214A and unexposed portions 214B as illustrated in FIG. 2B. The radiation beam used to expose the second material layer 214 may be ultraviolet and/or extended to include other radiation beams, such as ion beam, x-ray, extreme ultraviolet, deep ultraviolet, and other proper radiation energy. In one example, the second material layer 214 is exposed to a wavelength substantially less than 250 nm. The patterned exposed and unexposed portions 214A, 214B are formed by illuminating the second material layer with a radiation source through one or more photomasks (or reticles) to form an image pattern. The process may implement krypton fluoride (KrF) excimer lasers, argon fluoride (ArF) excimer lasers, ArF immersion lithography, ultraviolet (UV) radiation, extreme ultra-violet (EUV) radiation, and/or electron-beam (e-beam) writing. The exposing process may also be implemented or replaced by other proper methods such as maskless photolithography, ion-beam writing, and/or molecular imprint techniques. It is understood that a single exposure patterning process, double exposure patterning process, or multiple exposure patterning process may be performed. For example, the second material layer 214 may be exposed to a first wavelength, and then, exposed to a second wavelength.

Subsequently, the second material layer 214 may be subjected to a post-exposure bake (PEB) process. After a pattern exposure and/or post-exposure bake (PEB) process, the PAG in the second material layer 214 (i.e., photoresist) may produce an acid and thus increase or decrease its solubility. The solubility may be increased for positive tone resist (i.e., the acid will cleave an acid cleavable polymer, resulting in the polymer becoming more hydrophilic) and decreased for negative tone resist (i.e., the acid will catalyze an acid catalyzed crosslinkable polymer or cause a polymeric pinnacle to undergo pincaol rearrangement, resulting in the polymer becoming more hydrophobic).

Figure 2C:
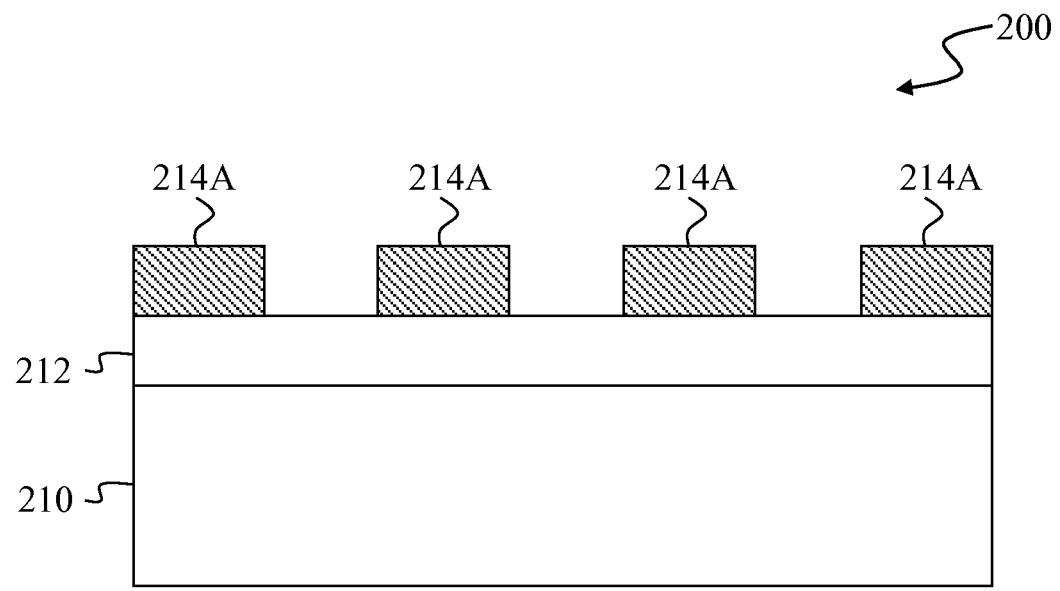

Referring to FIG. 2C, at block 110, the second material layer 214 is developed by any suitable process to form a pattern in the second material layer 214. A developing solution may be utilized to remove portions of the second material layer 214. An example of a developing solution is tetramethylammonium hydroxide (TMAH). Any concentration level of TMAH developer solution may be utilized, such as approximately 2.38% TMAH developer solution. The developing solution may remove the exposed or unexposed portions 214A, 214B depending on the resist type. For example, in the present example, the second material layer 214 comprises a negative-type resist, so the exposed portions 214A are not dissolved by the developing solution and remain over the first material layer 212 (or substrate 210). If the second material layer 214 comprises a positive-type resist, the exposed portions 214A would be dissolved by the developing solution, leaving the unexposed portions 214B behind. The semiconductor device may then be subjected to a rinsing process, such as a de-ionized (DI) water rinse. The rinsing process may remove residue particles.

The remaining exposed portions 214A (or unexposed portions 214B) define a pattern. The pattern contains one or more openings, wherein portions of the underlying first material layer 212 (or substrate 210) are exposed. Subsequent processing may include removing the exposed portions of the first material layer 212 and/or substrate 210 within the openings. Alternatively, metal deposition, ion implantation, or other processes can be carried out over/on the first material layer 212 and/or substrate 210. The second material layer 214, such as remaining exposed portions 214A, may be subjected to one or more treatment processes, including ion implantation processes, plasma treatment processes, UV treatment processes, other suitable processes, and/or combinations thereof. The ion implantation processes may be performed on the first layer 212 to implant exposed portions of the first material layer 212, also subjecting the patterned second material layer 214 to ion bombardment. The ions implanted may include arsenic, phosphorous, boron, nitrogen, carbon, germanium, oxygen, tellurium, other suitable ions. The ion bombardment may utilize halogen elements. The plasma treatment processes may employ a process gas mixture comprising any suitable plasma gas, such as O2 or nitrogen-containing compositions (e.g., N2O, N2H2, etc.). The plasma treatment may utilize at least one of a halogen, halogenated or non-halogenated composition, branched or non-branched composition, cyclic or non-cyclic composition, saturated or unsaturated composition, alkane composition, and/or other suitable compositions. The processes described may utilize any suitable temperature, such as a temperature range from about 22° C. to about 300° C. In one example, the operation temperature ranges from about 40° C. to about 120° C. The processes described may further utilize any suitable pressure, such as a pressure range from about 0.9 atm to about 10 atm.

Figure 2D:
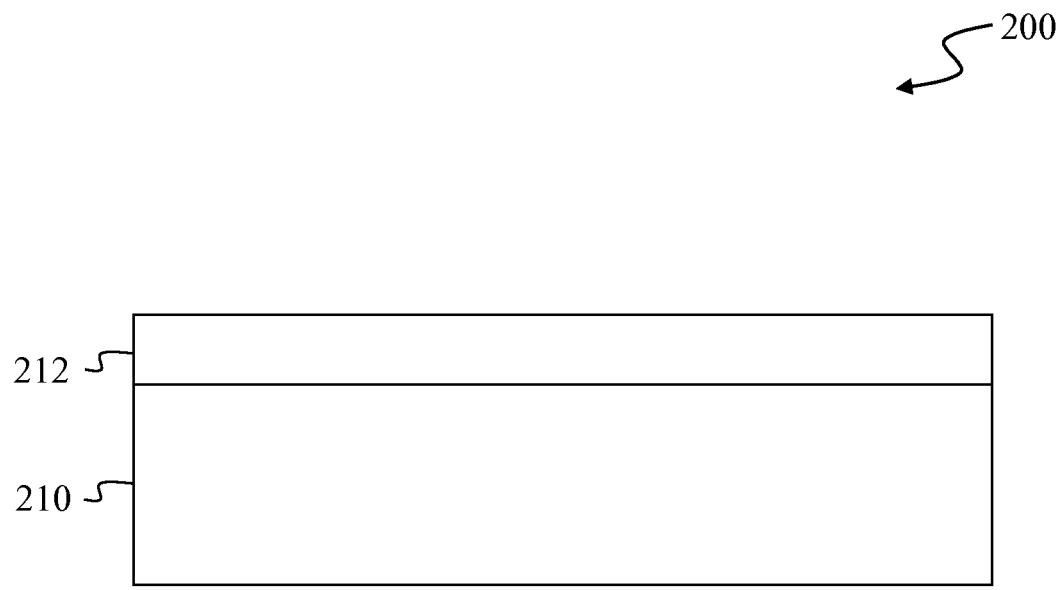

Referring to FIG. 2D, at block 112, the patterned second material layer 214 (i.e., remaining portions of the second material layer 214) is removed (or stripped) with a fluid. In cases where the patterned second material layer 214 is subjected to an ion bombardment or plasma treatment process, the fluid strips the ion bombarded, patterned second material layer 214 and/or the plasma treated, patterned second material layer 214. Conventional stripping solutions may exhibit varying disadvantages including damage to underlying layers (e.g., first material layer 212) and/or small amounts of photoresist material remaining on the underlying layers, which may result in deformities in subsequently formed layers. Thus, in the present disclosure, the patterned second material layer 214 (e.g., remaining exposed or unexposed portions 214A, 214B) is removed by a fluid including a steric hindered organic base and an organic solvent. The stripping solution including the steric hindered organic base may reduce substrate (or underlying layer) damage and/or eliminate (or reduce) the amount of photoresist material remaining after the stripping process.

The steric hindered organic base includes a primary amine, a secondary amine, a tertiary amine, or a quaternary amine hydroxide. The amine or amine hydroxide is represented by the formula:

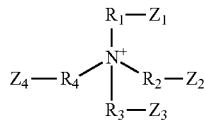

R1, R2, R3, and/or R4 include an unbranched group, a branched group, a cyclic group, a noncyclic group, a saturated group, an unsaturated group, or an alkyl chain. R1, R2, R3, and/or R4 may have a chain carbon number between about 1 and about 15. In an example, the chain carbon number is between about 1 and about 5. In the present example, at least one of R1, R2, R3, or R4 include a Vander Wall size larger than a benzene group.

Z1, Z2, Z3, and/or Z4 comprise a pendant group. The pendent group may be selected from the group consisting of: —Cl, —Br, —I, —NO2, —SO3—, —H—, —CN, —NCO, —OCN, —CO2—, —OH, —OR*, —OC(O)CR*, —SR, —SO2N(R*)2, —SO2R*, SOR, —OC(O)R*, —C(O)OR*, —C(O)R*, —Si(OR*)3, —Si(R*)3, or an epoxyl group. R* includes at least one of hydrogen, an unbranched or branched group, a cyclic or noncyclic group, a saturated or unsaturated group, an alkyl group, an alkenyl group, or an alkynyl group.

The organic solvent may comprise any suitable solvent, such as dimethyl sulfoxide (DMSO), tetrahydrofuran (THF), propylene glycol monomethyl ether (PGME), propylene glycol monomethyl ether acetate (PGMEA), ethanol, propanol, butynol, methanol, ethylene, glycol, gamabutylactone, N-methyl-2-pyrrolidone (NMP), other suitable solvents, and/or combinations thereof. In some examples, the organic solvent may comprise at least one of an alkylsulfoxide, a carboxylic ester, a carboxylic acid, an alcohol, a glycol, an aldehyde, a ketone, an acid anhydride, a lactone, a halogenated or non-halogenated group, a branched or non-branched group, a cyclic or noncyclic group, a saturated or unsaturated group, an alkane group, and/or a hetrocyclic ring.

The steric hindered organic base loading may be about 0.01% to about 40% of the organic solvent. The fluid may further comprise a stripping inhibitor, which can include at least glycol and/or diamine. Also, it has been observed that as H2O contamination decreases, damage to underlying layers (or the substrate) decreases. The stripping solution including the steric hindered organic base and organic solvent may advantageously dissolves the organic base in the organic solvent with H2O contamination of less than 5%. After the patterned second material layer 214 is removed, subsequent processing may continue. For example, the semiconductor device 200 may be subjected to one or more processes, such as additional patterning, etching, deposition, etc. processes, to form additional features.

In summary, the disclosed embodiments provide a method for fabricating an integrated circuit device. An exemplary photolithography process may include processing steps of photoresist coating, soft baking, mask aligning, exposing, post-exposure baking, developing, hard baking, and/or photoresist stripping. A photoresist stripping solution of the present disclosure includes a steric hindered organic base. The steric hindered organic base may provide one or more advantages, such as reduced substrate/underlying layer damage, reduced H2O contamination, and/or improved removal of photoresist materials. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist stripping composition comprising:
an organic solvent and an organic base, wherein the organic base is represented by the formula:

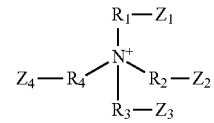

wherein $R_1$—$Z_1$, $R_2$—$Z_2$, $R_3$—$Z_3$, and $R_4$—$Z_4$ are steric hindered functional groups, and further wherein $R_1$, $R_2$, $R_3$, and $R_4$ are each an alkyl group and $Z_1$, $Z_2$, $Z_3$, and $Z_4$ are each a pendant group selected from the group consisting of —Cl, —Br, —I, —NO$_2$, —SO$_3$—, —H—, —CN, —NCO, —OCN, —CO$_2$—, —OC(O)CR*, —SR*, —SO$_2$N(R*)$_2$, —SO$_2$R*, —OC(O)R*, —C(O)R*, —Si(R*)$_3$, and an epoxyl group, and R* is selected from at least one of hydrogen, an unbranched group, a branched group, a cyclic group, a noncyclic group, a saturated group, an unsaturated group, an alkyl group, an alkenyl group, or an alkynyl group.

2. The photoresist stripping composition of claim 1, wherein $R_1$, $R_2$, $R_3$, and $R_4$ are selected from a group consisting of an unbranched group, a branched group, a cyclic group, a noncyclic group, a saturated group, and an unsaturated group.

3. The photoresist stripping composition of claim 1, wherein at least one of $R_1$, $R_2$, $R_3$, or $R_4$ includes an alkyl group larger than a benzene group.

4. The photoresist stripping composition of claim 1, wherein at least one of $R_1$, $R_2$, $R_3$, or $R_4$ has a chain carbon number ranging between 1 and 15.

5. The photoresist stripping composition of claim 1, wherein the pendant group is further selected from the group consisting of —OR, —SOR, —Si(OR)$_3$, and —C(O)OR, and R is selected from at least one of an unbranched group, a branched group, a cyclic group, a noncyclic group, a saturated group, an unsaturated group, an alkyl group, an alkenyl group, or an alkynyl group.

6. The photoresist stripping composition of claim 1, wherein the organic solvent comprises at least one of an alkylsulfoxide, a carboxylic ester, a carboxylic acid, an alcohol, a glycol, an aldehyde, a ketone, an acid anhydride, a lactone, a halogenated or non-halogenated group, a branched or non-branched group, a cyclic or noncyclic group, a saturated or unsaturated group, an alkane group, or a hetrocyclic ring.

7. The photoresist stripping composition of claim 6, wherein the organic solvent comprises dimethyl sulfoxide (DMSO), tetrahydrofuran (THF), propylene glycol monomethyl ether (PGME), propylene glycol monomethyl ether acetate (PGMEA), ethanol, propanol, butynol, methanol, ethylene, glycol, gamabutylactone, N-methyl-2-pyrrolidone (NMP), or combinations thereof.

8. The photoresist stripping composition of claim 1, wherein the organic base is present in an amount of about 0.01% to about 40% of the organic solvent.

9. The photoresist stripping composition of claim 1, further comprising a stripping inhibitor.

10. A photoresist stripping composition comprising:
an organic solvent and an organic base, wherein the organic base is represented by the formula:

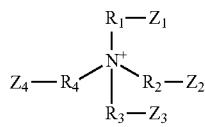

wherein $R_1$, $R_2$, $R_3$, and $R_4$ are each an alkyl group and $Z_1$, $Z_2$, $Z_3$, and $Z_4$ are each a pendant group selected from the group consisting of —Cl, —Br, —I, —NO$_2$, —SO$_3$—, —H—, —CN, —NCO, —OCN, —CO$_2$—, —OR, —OC(O)CR*, —SR*, —SO$_2$N(R*)$_2$, —SO$_2$R*,—SOR, —OC(O)R*, —C(O)OR, —C(O)R*, —Si(OR)$_3$, —Si(R*)$_3$, and an epoxyl group, wherein R* is selected from at least one of hydrogen, an unbranched group, a branched group, a cyclic group, a noncyclic group, a saturated group, an unsaturated group, an alkyl group, an alkenyl group, or an alkynyl group, and R is selected from at least one of an unbranched group, a branched group, a cyclic group, a noncyclic group, a saturated group, an unsaturated group, an alkyl group, an alkenyl group, or an alkynyl group.

11. The photoresist stripping composition of claim 10, wherein $R_1$, $R_2$, $R_3$, and $R_4$ are selected from a group consisting of an unbranched group, a branched group, a cyclic group, a noncyclic group, a saturated group, and an unsaturated group.

12. The photoresist stripping composition of claim 10, wherein at least one of $R_1$, $R_2$, $R_3$, or $R_4$ includes an alkyl group larger than a benzene group.

13. The photoresist stripping composition of claim 10, wherein the organic solvent comprises at least one of an alkylsulfoxide, a carboxylic ester, a carboxylic acid, an alcohol, a glycol, an aldehyde, a ketone, an acid anhydride, a lactone, a halogenated or non-halogenated group, a branched or non-branched group, a cyclic or noncyclic group, a saturated or unsaturated group, an alkane group, or a hetrocyclic ring.

14. The photoresist stripping composition of claim 10, wherein the organic base is present in an amount of about 0.01% to about 40% of the organic solvent.

15. The photoresist stripping composition of claim 10, further comprising a stripping inhibitor.

16. A photoresist stripping composition comprising:
an organic solvent and an organic base, wherein the organic base is represented by the formula:

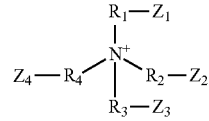

wherein $R_1$, $R_2$, $R_3$, and $R_4$ are selected to include an alkyl group larger than a benzene group and $Z_1$, $Z_2$, $Z_3$, and $Z_4$ are selected from the group consisting of: —Cl, —Br, —I, —NO$_2$, —SO$_3$—, —H—, —CN, —NCO, —OCN, —CO$_2$—, —OC(O)CR*, —SR*, —SO$_2$N(R*)$_2$, —SO$_2$R*, —OC(O)R*, —C(O)R*, —Si(R*)$_3$, and an epoxyl group, and R* is selected from at least one of hydrogen, an unbranched group, a branched group, a cyclic group, a noncyclic group, a saturated group, an unsaturated group, an alkyl group, an alkenyl group, or an alkynyl group.

17. The photoresist stripping composition of claim 16, wherein $Z_1$, $Z_2$, $Z_3$, and $Z_4$ are further selected from the group consisting of —OR, —SOR, —C(O)OR, and —Si(OR)$_3$, and R is selected from at least one of an unbranched group, a branched group, a cyclic group, a noncyclic group, a saturated group, an unsaturated group, an alkyl group, an alkenyl group, or an alkynyl group.

18. The photoresist stripping composition of claim 16, wherein the organic solvent comprises at least one of an alkylsulfoxide, a carboxylic ester, a carboxylic acid, an alcohol, a glycol, an aldehyde, a ketone, an acid anhydride, a lactone, a halogenated or non-halogenated group, a branched or non-branched group, a cyclic or noncyclic group, a saturated or unsaturated group, an alkane group, or a hetrocyclic ring.

19. The photoresist stripping composition of claim 16, wherein the organic base is present in an amount of about 0.01% to about 40% of the organic solvent.

20. The photoresist stripping composition of claim 16, further comprising a stripping inhibitor.

\* \* \* \* \*